US011852525B2

(12) United States Patent
Adusumalli et al.

(10) Patent No.: US 11,852,525 B2
(45) Date of Patent: Dec. 26, 2023

(54) AMBIENT LIGHT SENSOR CIRCUITS WITH A DELTA-SIGMA ANALOG TO DIGITAL CONVERTER WITH A SWITCH NETWORK

(71) Applicant: ams International AG, Jona (CH)

(72) Inventors: Ravi Kumar Adusumalli, Eindhoven (NL); Rahul Thottathil, Eindhoven (NL); Gowri Krishna Kanth Avalur, Eindhoven (NL); Sudhakar Singamala, Eindhoven (NL)

(73) Assignees: PAX WATER TECHNOLOGIES INC., Richmond, CA (US); AMS INTERNATIONAL AG, Jona (CH)

( * ) Notice: Subject to any disclaimer, the term of this patent is extended or adjusted under 35 U.S.C. 154(b) by 0 days.

(21) Appl. No.: 17/774,854

(22) PCT Filed: Dec. 18, 2020

(86) PCT No.: PCT/EP2020/087086
§ 371 (c)(1),
(2) Date: May 5, 2022

(87) PCT Pub. No.: WO2021/130124
PCT Pub. Date: Jul. 1, 2021

(65) Prior Publication Data
US 2022/0393697 A1    Dec. 8, 2022

Related U.S. Application Data

(60) Provisional application No. 62/953,664, filed on Dec. 26, 2019.

(51) Int. Cl.
*G01J 1/42* (2006.01)
*G01J 1/18* (2006.01)
(Continued)

(52) U.S. Cl.
CPC ............. *G01J 1/4204* (2013.01); *G01J 1/18* (2013.01); *G01J 1/46* (2013.01); *H03M 3/368* (2013.01);
(Continued)

(58) Field of Classification Search
CPC .... G01J 1/18; G01J 1/4204; G01J 1/46; G01J 2001/446; H03M 3/368; H03M 3/458; H03M 3/43; H03M 3/502
See application file for complete search history.

(56) References Cited

U.S. PATENT DOCUMENTS

2006/0213270 A1* 9/2006 O'Dowd ................. G01D 5/24
73/514.32
2013/0147496 A1* 6/2013 Moedl ................ G01R 27/2605
324/679

FOREIGN PATENT DOCUMENTS

EP    3402079 A1 * 11/2018    ............. B60L 58/22
WO    91/11863 A1    8/1991

OTHER PUBLICATIONS

International Search Report and Written Opinion issued in connection with PCT Patent Application No. PCT/EP2020/087086 dated Mar. 30, 2021.

* cited by examiner

*Primary Examiner* — Jennifer D Bennett
(74) *Attorney, Agent, or Firm* — Tarolli, Sundheim, Covell & Tummino, LLP

(57) ABSTRACT

An ambient light sensor is provided that includes a sensor input having a delta-sigma analogue to digital converter. The delta-sigma analogue to digital converter includes a switched capacitor, a common mode voltage source, a reference voltage source, and a switch network. In a first clock phase, the switch network connects the switched capacitor to charge it to either a sum or difference voltage.

(Continued)

In a second clock phase, the switch network connects the switched capacitor to transfer charge into a summing junction. A controller controls the switch network in response to a comparator output to connect the switched capacitor to either the common mode voltage or the reference voltage while in the first clock phase.

15 Claims, 14 Drawing Sheets

(51) Int. Cl.
    *G01J 1/46*          (2006.01)
    *H03M 3/00*         (2006.01)
    *G01J 1/44*          (2006.01)

(52) U.S. Cl.
    CPC ....... *H03M 3/458* (2013.01); *G01J 2001/446* (2013.01)

AMBIENT LIGHT SENSOR CIRCUITS WITH A DELTA-SIGMA ANALOG TO DIGITAL CONVERTER WITH A SWITCH NETWORK

RELATED APPLICATIONS

The present invention is a U.S. National Stage under 35 USC 371 patent application, claiming priority to Serial No. PCT/EP2020/087086, filed on Dec. 18, 2020, which claims priority from U.S. Provisional Application No. 62/953,664 filed on Dec. 26, 2019; the entireties of both are hereby incorporated herein by reference.

BACKGROUND

This specification generally relates to sensor circuits including a delta-sigma analogue to digital converter. The sensor circuits can be used with light sensors and other sensors.

It is useful for electronic devices such as mobile phones to be able to sense ambient light level e.g. so that the display illumination can be controlled to reduce power consumption. Previous disclosures of ambient sensor circuits include US2014/293272 (U.S. Pat. No. 9,146,162) and EP2863192. US 2014/293272 describes an integrating analogue-to-digital converter which is switchable between light and temperature sensors. EP2863192 describes an analogue-to-digital converter with two phase operation, one phase including a charge balancing operation.

SUMMARY

There is generally described a sensor circuit which includes a delta-sigma analogue to digital converter with a switch network configuration which facilitates increased gain and reduced noise operation compared with some prior art delta-sigma analogue to digital conversion techniques.

According to a first aspect there is provided a sensor circuit comprising a sensor input. The sensor circuit may include a delta-sigma analogue to digital converter comprising a first integrator having a first summing junction at a first integrator input, a first feedback capacitor, and a first integrator output. The sensor input may be coupled to the first summing junction. The sensor circuit may further include a comparator coupled to the first integrator output and configured to compare the first integrator output with a comparator reference to generate a comparator output. The sensor circuit may further include a digital output coupled to the comparator output, and a converter clock.

The delta-sigma analogue to digital converter may further comprise a first switched capacitor, a common mode voltage source providing a common mode voltage ($V_{cm}$), a reference voltage source providing a reference voltage ($V_{ref}$), and a first switch network. The first switch network may be configured to, in a first clock phase, connect the first switched capacitor to one of the common mode voltage and the reference voltage to charge the switched capacitor to either a sum of the common mode voltage and the reference voltage or a difference between the common mode voltage and the reference voltage, and in a second clock phase, connect the first switched capacitor to transfer charge from the first switched capacitor into the first summing junction and a controller to control the first switch network responsive to the comparator output to selectively connect the first switched capacitor to one of the common mode voltage and the reference voltage in the first clock phase.

In implementations such an approach allows the first switched capacitor to sample either ($V_{cm}+V_{ref}$) or ($V_{cm}-V_{ref}$) depending on the comparator output. Thus in implementations the integrator output (and digital code) may depend on a period (frequency) of the clock but not the total conversion time. However a naïve implementation of such an approach can result in clock feedthrough. Implementations of the above described first switch network can substantially reduce this and other switch-associated errors e.g. arising from charge injection. In some implementations $V_{ref}$ may be less than $V_{cm}$.

Some other advantages of the above and later described features include gain programmability, e.g. by varying the clock frequency or reference voltage. The described circuit configurations facilitate a high gain and low noise, e.g. resolving currents in the fA range, which facilitates measuring very low light levels. In implementations the noise is reduced by the over-sampling ratio (OSR) and may be independent of the sensed signal (light input) for a given gain. The described switching arrangements can provide noise shaping and facilitate decimation for improved signal-to-noise (SNR) ratio sensing.

Implementations of the sensor circuit can measure both positive and negative photodiode currents, in particular photodiode leakage or dark currents. A zero-light condition, which corresponds to zero current input, can then be defined for the digital output; this may be defined as a mid-code digital output.

In an embodiment, the switch network comprises a controllable common mode voltage switch and a controllable reference voltage switch each coupled to a first terminal of the first switched capacitor. A controllable ground switch may be coupled to a second terminal of the first switched capacitor. A controllable integrator input switch may be coupled between the second terminal of the first switched capacitor and the summing junction. This provides an efficient implementation of the first switch network.

The controller may then be configured to, in the first clock phase, control the controllable common mode voltage switch and the controllable reference voltage switch to connect the first terminal of the first switched capacitor to one of the common mode voltage and the reference voltage and to control the controllable ground switch to connect the second terminal of the first switched capacitor to ground. The controller may be configured to, in the second clock phase, control the controllable integrator input to couple the second terminal of the first switched capacitor to the summing junction.

In an embodiment, the analogue to digital converter further comprises a second integrator coupled between the first integrator and the comparator, the second integrator comprising a second summing junction at a second integrator input, a second feedback capacitor and a second integrator output, the second integrator input being coupled to the first integrator output and the second integrator output being coupled to the comparator input. This can facilitate an increased gain with low noise.

The sensor circuit may further comprise a coupling capacitor and a coupling switch network, to couple the first integrator output to the second integrator input. The coupling switch network may be configured first to couple a voltage from the first integrator output to charge the coupling capacitor and then to couple charge from the coupling capacitor to the second integrator input. A gain of the sensor circuit may be determined by a ratio of a value of the second feedback capacitor to a value of the coupling capacitor.

In a particular embodiment, the coupling switch network comprises a first coupling switch coupling the first integrator output and a first terminal of the coupling capacitor; a second coupling switch coupling the first terminal of the coupling capacitor and the common mode voltage source, a third coupling switch coupling a second terminal of the coupling capacitor to the second integrator input, and a fourth coupling switch coupling the second terminal of the coupling capacitor the common mode voltage source.

This facilitates coupling two stages of a second-order delta sigma analogue to digital converter where each stage includes a switch network as previously described.

Thus the sensor circuit may further comprise a second switched capacitor coupled to the second summing junction, and a second switch network configured to, in the second clock phase, connect the second switched capacitor to one of the common mode voltage and the reference voltage to charge the switched capacitor to either a sum of the common mode voltage and the reference voltage or a difference between the common mode voltage and the reference voltage, and in the first clock phase, connect the second switched capacitor to transfer charge from the switched capacitor into the second summing junction.

In a second-order delta sigma analogue to digital converter the converter clock may be configured to provide a first phase timing signal ($\phi_1$) defining the first clock phase and controlling the third coupling switch, a first further phase timing signal ($\phi_{1d}$) controlling the second coupling switch, a second phase timing signal ($\phi_2$) defining the second clock phase and controlling the fourth coupling switch, and a second further phase timing signal ($\phi_{2d}$) controlling the first coupling switch.

In an embodiment, one or more of (where present) of the first switched capacitor, the coupling capacitor, the second switched capacitor, the first feedback capacitor, and the second feedback capacitor, may be variable e.g. switched capacitors. This can facilitate programming a gain of the analogue to digital converter. However in some implementations it may be preferable to vary the gain using the clock frequency and/or reference voltage rather than introducing switches into the signal path.

The sensor circuit may further comprise a decimator coupled between the comparator output and the digital output. This further facilitates noise reduction. In implementations the decimator may comprise a cascaded integrator-comb (CIC) filter e.g. a third order CIC filter.

In an embodiment, the controller further comprises a latch circuit coupled between the comparator output and the controller to synchronize changes in the comparator output to one or both of the first clock phase and the second clock phase. This can help to ensure non-overlapping control signals.

In some implementations the controller may further comprise logic circuitry to combine the comparator output synchronized to the first clock phase ($\phi_1$) with the first further phase timing signal ($\phi_{1d}$); and to combine the comparator output synchronized to the second clock phase ($\phi_2$) with the second further phase timing signal ($\phi_{2d}$), to generate combined signals for the logic circuitry to generate one or more control signals to control the first switch network. However in some other implementations such logic circuitry may be omitted and switches of the first (or second) switch network, e.g. the controllable common mode voltage switch and the controllable reference voltage switch may be replicated.

In some implementations the sensor circuit is configured to transfer charge to the first feedback capacitor on each clock cycle irrespective of a comparator decision indicated by the comparator output.

The circuit may be used with a photodiode for a light sensor such as an ambient light sensor for an electronic device such as a portable computing device or mobile phone.

Thus the photodiode may be coupled to the sensor input.

BRIEF DESCRIPTION OF THE FIGURES

The sensor circuit will now be described by way of example embodiments with reference to the following drawings.

DETAILED DESCRIPTION

There is described herein a low noise, high sensitivity, delta sigma analogue to digital converter sensor circuit for a sensor. The sensor may be a light sensor such as an ambient light sensor; the delta sigma analogue to digital converter may be a second order converter.

Figure 1:
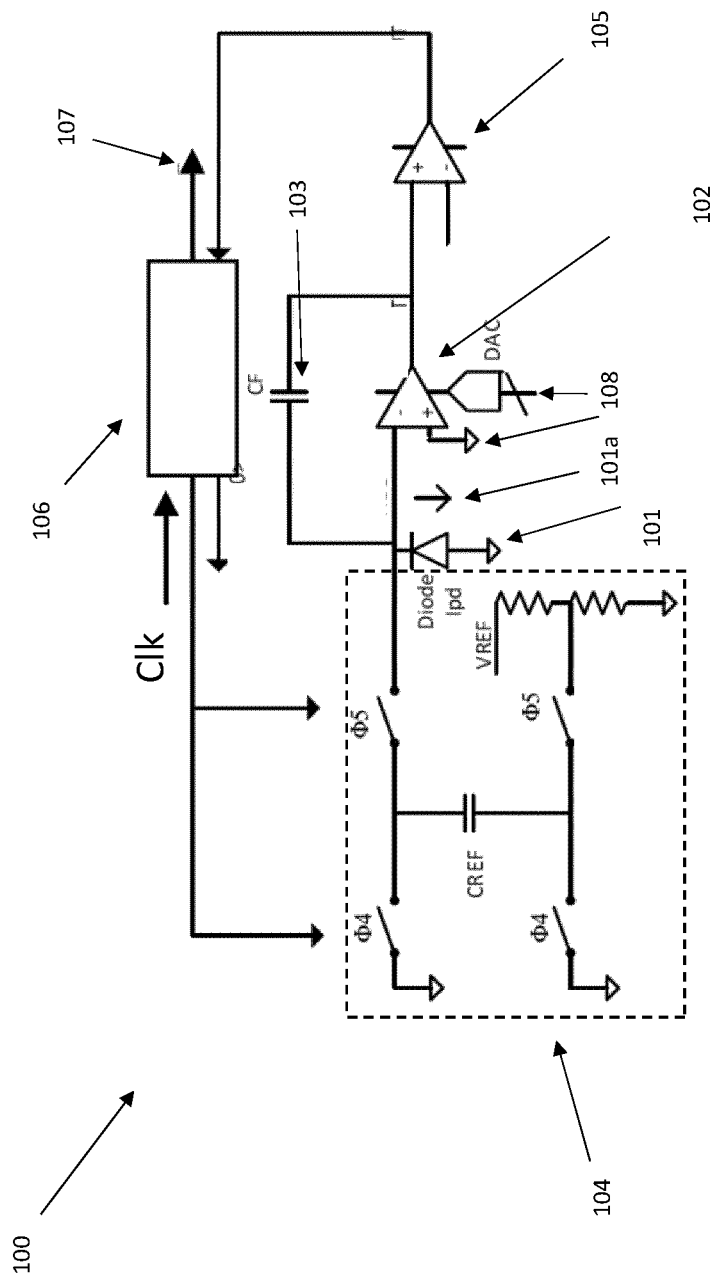
FIG. 1 is a schematic diagram of an ambient light sensor system.

FIG. 1 is a schematic diagram of an ambient light sensor system 100. The system comprises a photodiode 101, an operational amplifier 102 configured to operate as an integrator by an integrating capacitor CF 103, a switched reference circuit 104 including a reference capacitor CREF, a comparator 105, and control logic 106 providing a digital output 107 and optionally a trim signal 108 to control an offset of operational amplifier 102. High and low (e.g. ground) references voltage VREFh and VRFEFl are provided to the switched reference circuit 104.

In operation the integrator integrates a current 101a through the photodiode, thus ramping the voltage at the output of the operational amplifier. This voltage is compared with a reference voltage using the comparator. When the output voltage of the operational amplifier crosses the reference voltage, the comparator triggers, and a voltage is provided at the output, and the process repeats. The number of times the comparator output triggered in a given time is referred as the count; the count gives an indication of the level of the ambient light. The system uses an asynchronous clock.

The voltage provided at the output is given by:

$$(VREFl+VREFh)*(CF/CREF) \quad \text{Equation 1}$$

The count equation is:

$$\text{Count} = \frac{I_{photo} \times T_{int}}{C_{ref} \times (V_{refh} + V_{refl})} \quad \text{Equation 2}$$

There is now described a low noise, high sensitivity delta sigma analogue to digital converter sensor circuit. More specifically there is described a delta sigma converter in which the charge dump comprises two levels according to the comparator decision. In an embodiment, the charge dump occurs on each clock cycle. In a further embodiment, a second stage for the delta sigma converter is provided. This enables improved signal-to-noise ratio. A decimator may provide a further improvement in signal to noise ratio and noise shaping.

In implementations the output signal is proportional to a clock rate, Tclk, irrespective of the total conversion time compared to conventional light to digital converter. Implementations have the capability to measure the positive and negative dark currents (photo-diode leakage, circuit leakage). The zero-light condition (zero current input) can be referred as mid-code. Furthermore, gain programmability can be achieved by varying the clock rate and the reference voltage. Results from use of devices according to embodiments of the disclosure indicate that higher gains (up to 40×) can be achieved compared to the conventional light to digital converter. Devices according to embodiments of the disclosure can also measure very low light levels with reduced noise.

In a first embodiment, there is a provided single stage Delta Sigma converter. In this embodiment, a two-phase approach is used. The sensor circuit comprises a diode which is connected to negative terminal of an integrator, a sampling network which is configured, in a first phase, to sample a reference voltage and, in a second phase, to transfer the sampled voltage to the integrator circuit, and a comparator. The voltage transferred depends upon a comparator decision of a previous clock cycle. Two voltage levels are provided. In an embodiment, these voltages are a common mode voltage, referred to as Vcm, and a reference voltage Vref. Typically, the reference voltage is lower than the common mode voltage. In an embodiment, the common mode voltage is also the decision level voltage of the comparator. If comparator decision is high the reference voltage connected is equal to Vcm+Vref and if the comparator decision is low, Vcm−Vref is connected. In this manner, a charge transfer occurs on every clock cycle, wherein a clock cycle, Tclk, comprises the first phase and the second phase. The transfer on each clock cycle occurs irrespective of the comparator decision. The person skilled in the art will appreciate that there are alternative implementations, such as providing two voltage levels, one above and one below the comparator decision level. The invention is not limited to the details of the arrangement of the sampling circuit.

The use of a single reference scheme to create balanced references Vrefp (Vcm+Vref) and Vrefn (Vcm−Vref)) can overcome problems whereby a small mismatch can cause large error in the output code. The single reference scheme uses only Vref and Vcm to create balanced references. In some implementations the switching timing described later is facilitated by latching the comparator output in each of clock phases $\phi_1$ and $\phi_2$.

Figure 2:
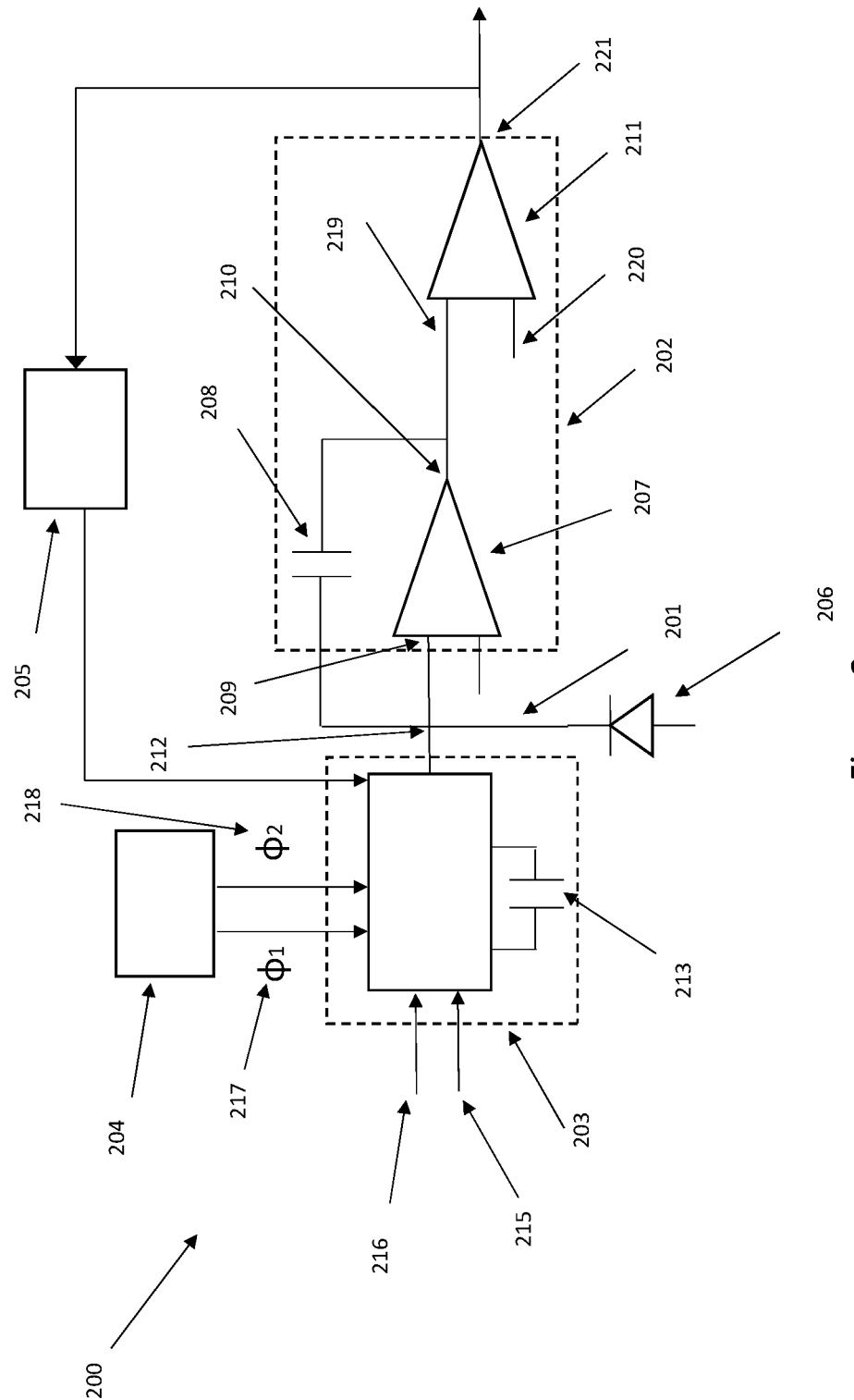
FIG. 2 is a schematic diagram of a sensor circuit according to an embodiment.

FIG. 2 is a schematic diagram of a sensor circuit 200 according to an embodiment. The sensor circuit comprises a sensor input 201, a delta-sigma analogue to digital converter 202, a first switch network 203, a converter clock 204 and a controller 205. In implementations the sensor input 201 receives an analogue, e.g. current, input signal.

In the embodiment of FIG. 2, the sensor input is shown attached to a photodiode 206. A second terminal of the photodiode may be connected to at ground or another reference voltage. In some implementations the sensor circuit may have a multiple channel input and digital output, e.g. by duplicating parts or all of the circuit shown in FIG. 2 and/or by multiplexing the circuit. For example the photodiode 206 may sense at more than one wavelength e.g. it may sense red, green and/or blue colours and/or may sense over more than one of these colours. For example a sensor such as a photopixel, e.g. having red, green, blue and clear filters over one or more light sensing elements e.g. photodiodes, may be employed. In other applications the circuit may be used with other input devices, for example, but not limited, to a temperature sensor.

The delta sigma converter 202 comprises a first integrator 207, a first feedback capacitor 208, a first integrator input 209, a first integrator output 210 and a comparator 211. The integrator has a first summing junction 212 at a first integrator input, wherein the sensor input is coupled to the first summing junction. In an embodiment, the integrator is configured as an inverting amplifier, with the negative terminal being the first integrator input and the positive terminal being at ground or another reference voltage. The output 210 of the first integrator is coupled to a first input 219 of the comparator 211. A second input 220 of the comparator is coupled to a reference voltage level, which, in an embodiment, is the common mode voltage. The output 221 of the comparator is connected to the controller 205 and may also provide a digital output from the analogue to digital converter.

The sensor circuit further comprises a first switched capacitor 213, which in operation is charged to a first voltage level or second voltage level. In the embodiment, the first voltage level is equal to the sum of a common mode voltage and a reference voltage, and the second voltage level is equal to the difference common mode voltage and the reference voltage. In an embodiment, the common mode voltage is equal to the reference voltage of the comparator 211. The first switch network 203 controls the charging of the first switched capacitor and has a common mode voltage source 215 providing the common mode voltage and a reference voltage source 216 providing the reference voltage.

In operation, the device according to the embodiment of FIG. 2 has two phases. In a first phase, a voltage is sampled by the first switch network. In the second phase, the first switch network is connected to the summing input of the integrator. In this way, a charge dump occurs onto the first feedback capacitor.

In an embodiment, the converter clock provides a first timing signal ($\phi_1$) 217 and the second timing signal ($\phi_2$) 218, to initiate respectively the first phase and the second phase. In the first phase, the first switch network is configured so as to connect the first switched capacitor to one or more voltage sources, so as to provide a first or a second voltage level. In an embodiment, a common mode voltage and a reference voltage are provided, so as to charge the switched capacitor to either a sum of the common mode voltage and the reference voltage or a difference between the common mode voltage and the reference voltage.

In the second phase, the first switched capacitor is coupled with the summing junction of the first integrator so as to transfer charge from the first switched capacitor into the first summing junction. The level of the voltage samples by the first switch capacitor on comparator output. If the comparator output to logical "1", voltage is equal to the first level, namely, the sum of the common mode voltage and the reference voltage. If the comparator output is logical "0", the voltage is equal to the second level, namely, the difference between the common mode voltage and the reference voltage.

In an embodiment, the first switch network comprises a controllable common mode voltage switch and a controllable reference voltage switch each coupled to a first terminal of the first switched capacitor, a controllable ground switch coupled to a second terminal of the first switched capacitor, and a controllable integrator input switch coupled between the second terminal of the first switched capacitor and the summing junction.

Figure 3:
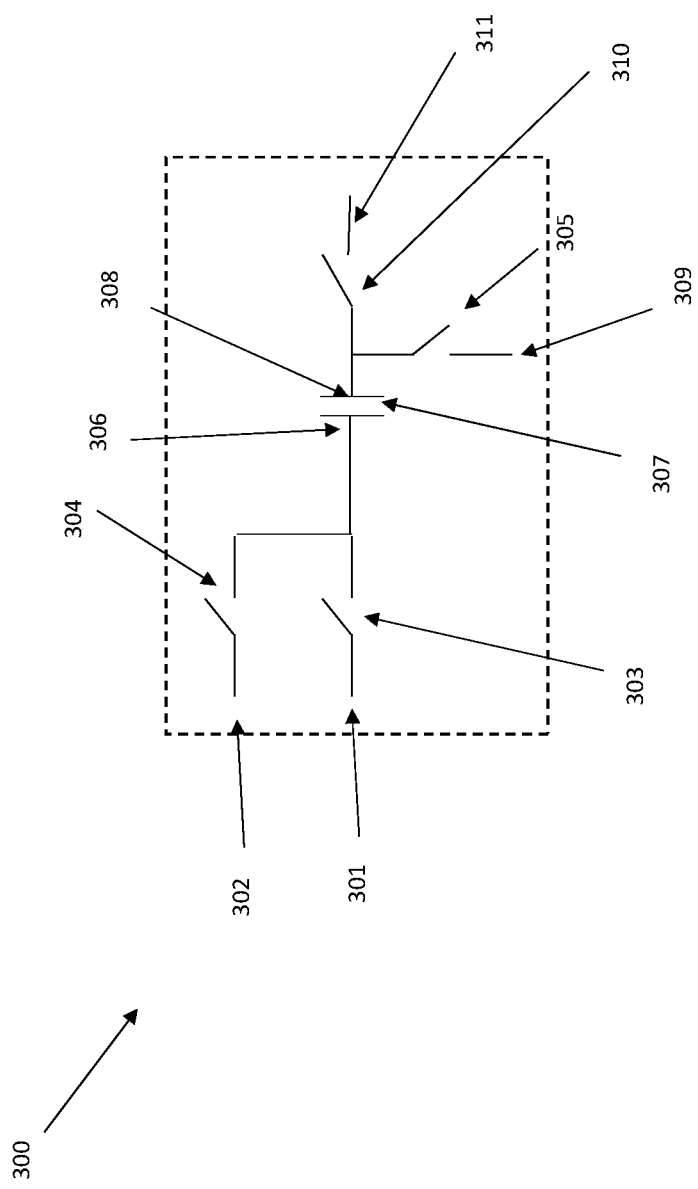
FIG. 3 is a schematic diagram of a first switch network according to an embodiment.

FIG. 3 is a schematic diagram of a switch network 300 according to an embodiment. There is provided a voltage source providing the common mode voltage 301, a voltage source providing the reference voltage 302, a controllable common mode voltage switch 303, a controllable reference voltage switch 304 and a controllable ground switch 305. The controllable common mode voltage switch 303 and the controllable reference voltage switch 304 are connected to a first terminal 306 of a first switched capacitor 307. The controllable common mode voltage switch 303 enables the first terminal 306 to be connectable to the common mode voltage source 301 and the controllable reference voltage switch 304 enables the first terminal 306 to be connectable to the reference voltage source 302. The controllable ground switch 305 enables the second terminal 308 of the first switch capacitor to be connectable to ground 309. The controllable common mode voltage switch and controllable reference voltage switch enable charging of the first switched capacitor 307. The first switch network further comprises a controllable integrator input switch 310, which enables the second terminal of the first switch capacitor to be connectable to an output 311 of the first switch network.

Figure 4:
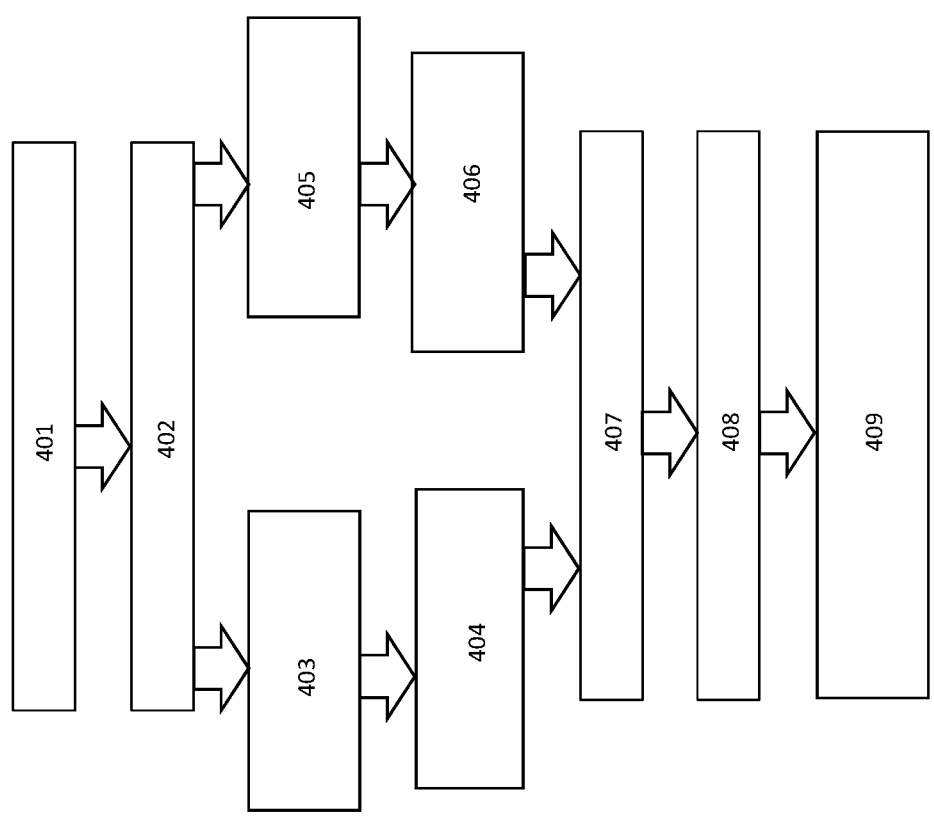
FIG. 4 is a flowchart indicating operations of the controller according to an embodiment.

FIG. 4 is a flowchart illustrating the steps of operation of the embodiment of FIG. 2. The steps are controlled by the controller 205 in response to a comparator decision and first and second timing signals provided by the converter clock 204. After a first timing signal 401, if the comparator decision 402 is at a logical level "1" 405, then the sampled voltage is set 404 to be equal to the sum of common mode voltage and the reference voltage. If the comparator decision 402 is at a logical level "0" 403, then the sampled voltage is set 406 to be equal to the difference between the common mode voltage and the reference voltage. The voltage is sampled 407, and the first switched capacitor is charged. Upon receipt of a second timing signal 408, the first switched capacitor is coupled 409 to the summing junction. This results in a charge dump onto the first feedback capacitor.

Figure 5B:
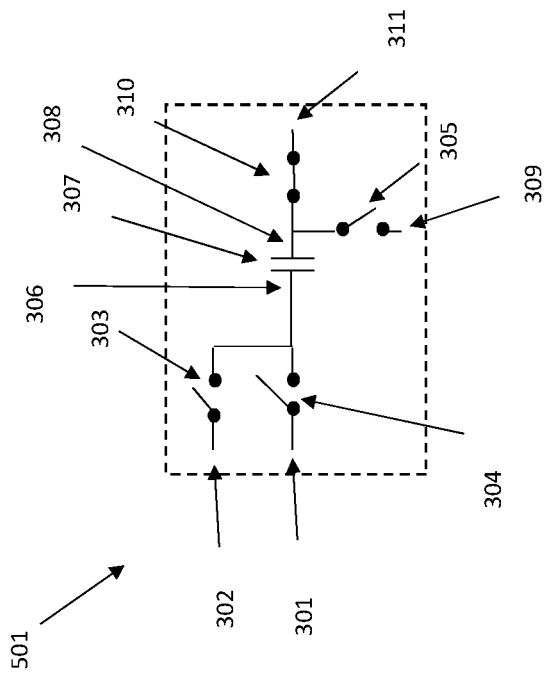
FIG. 5(b) is a schematic diagram of the switch network configured according to a second clock phase.
Figure 5A:
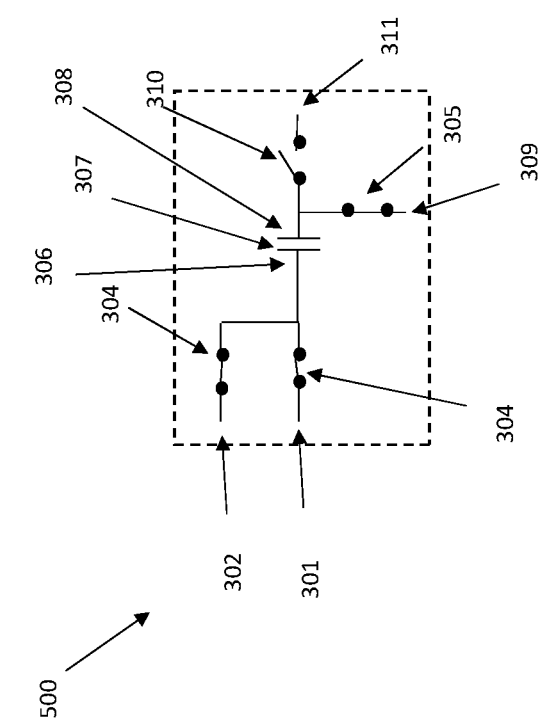
FIG. 5(a) is a schematic diagram of switch network configured according to a first clock phase.

FIGS. 5(a) and 5(b) are schematic diagrams showing the first switch network of the embodiment of FIG. 3 during a first clock phase 500 and a second clock phase 501 respectively. In FIG. 5(a), the controllable common mode voltage switch 303, controllable reference voltage switch 304 and the controllable ground switch 305 shown as closed, to enable the charging of the first switched capacitor. The controllable integrator input switch 310 is open. In FIG. 5(b), the controllable common mode voltage switch 303, the controllable reference voltage switch 304 and the controllable ground switch 305 are open, and the controllable integrator input switch 310 is closed, to couple the switched capacitor with the summing junction of the integrator circuit. During the second phase, the coupling the switched capacitor the summing junction results in a charge dump onto the feedback capacitor of the integrator circuit. The charge dump can be at two levels, one corresponding to a first voltage level and the second corresponding to a second voltage level. The voltage level and hence the level of the charge dump are controlled by the comparator decision of the previous clock cycle. In an embodiment, the first voltage level is equal to the sum of the common mode voltage and the reference voltage, and the second voltage level is equal to the difference between the common mode voltage and the reference voltage. The arrangement enables a hybrid voltage and current input, in which the sensor input is continuously connected to the integrator circuit. During the clock cycle comprising the first and second phases the current from the sensor is accumulated on the first feedback capacitor.

In an embodiment, the delta sigma converter is a two-stage device. A two-stage delta sigma converter enables increased noise reduction and hence an improvement in signal to noise ratio compared with a single stage device. A two-stage converter typically has, in addition to the features of a single stage device, a second integrator, a second feedback capacitor, a feedback circuit and a coupling circuit for coupling the device to the first stage. The second stage receives an input from the first stage and provides an output to the comparator.

Figure 6:
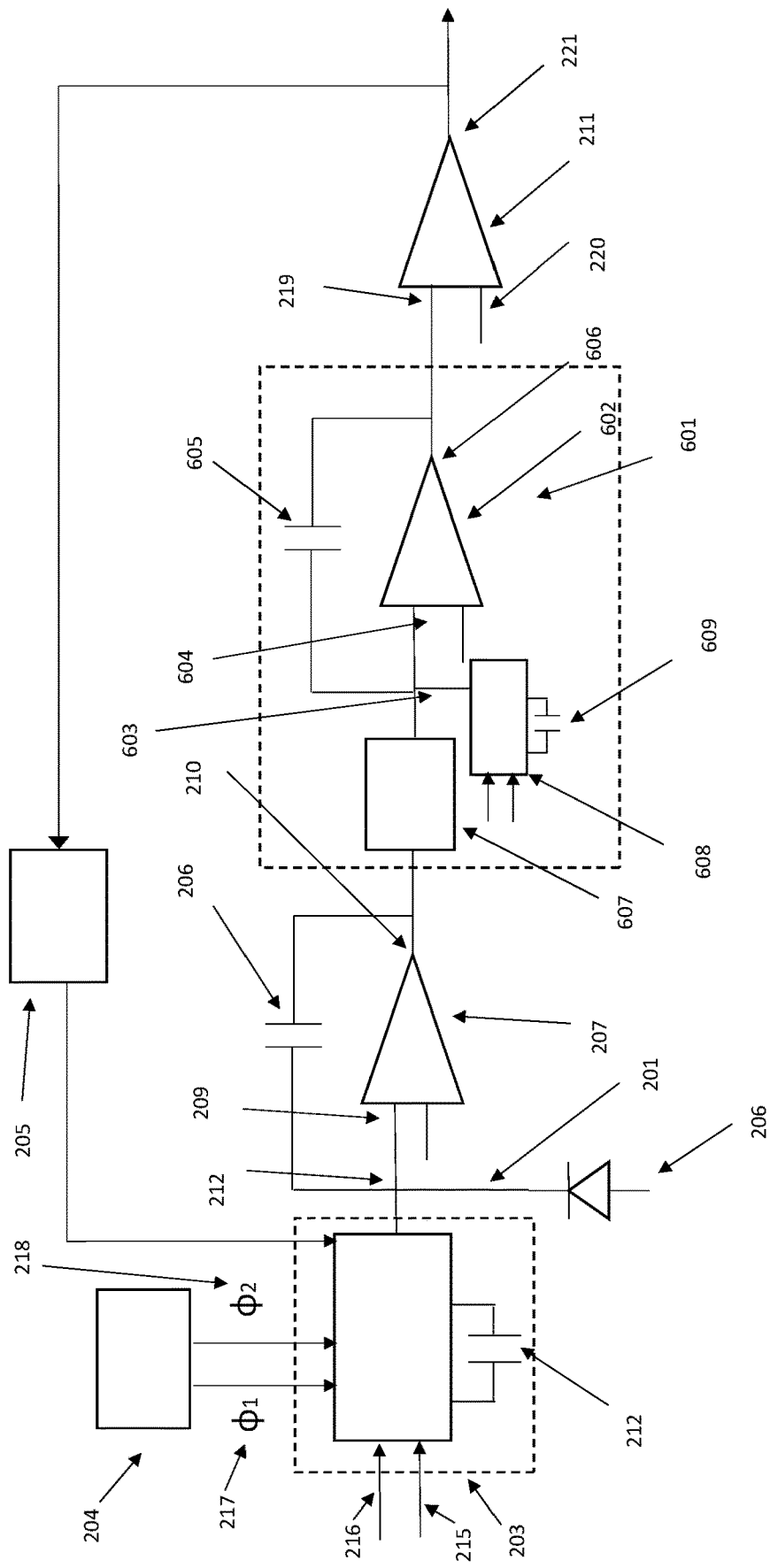
FIG. 6 is a schematic diagram of a sensor circuit with a second stage integrator according to an embodiment.

FIG. 6 is a schematic diagram of a sensor circuit with a two-stage sigma delta converter according to an embodiment. The embodiment illustrated in FIG. 6 comprises the features of the embodiment of FIG. 2, and a further second stage 601. There is provided a second integrator 602 coupled between the first integrator 207 and the comparator 211. The second integrator 602 comprises a second summing junction 603 at a second integrator input 604, a second feedback capacitor 605 and a second integrator output 606. The second integrator input 604 is coupled to the first integrator output 210 and the second integrator output 606 is coupled to the first comparator input 219. In an embodiment, the second integrator is configured as an inverting amplifier, with the negative terminal being the second integrator input and the positive terminal being at a reference voltage such as the common mode voltage. In an embodiment, there is provided a coupling switch network 607 to connect the first and second stages of the delta sigma converter. In an embodiment, there is provided a second switch circuit 608 with a second switched capacitor 609 to provide a feedback circuit for the second stage integrator.

Figure 7:
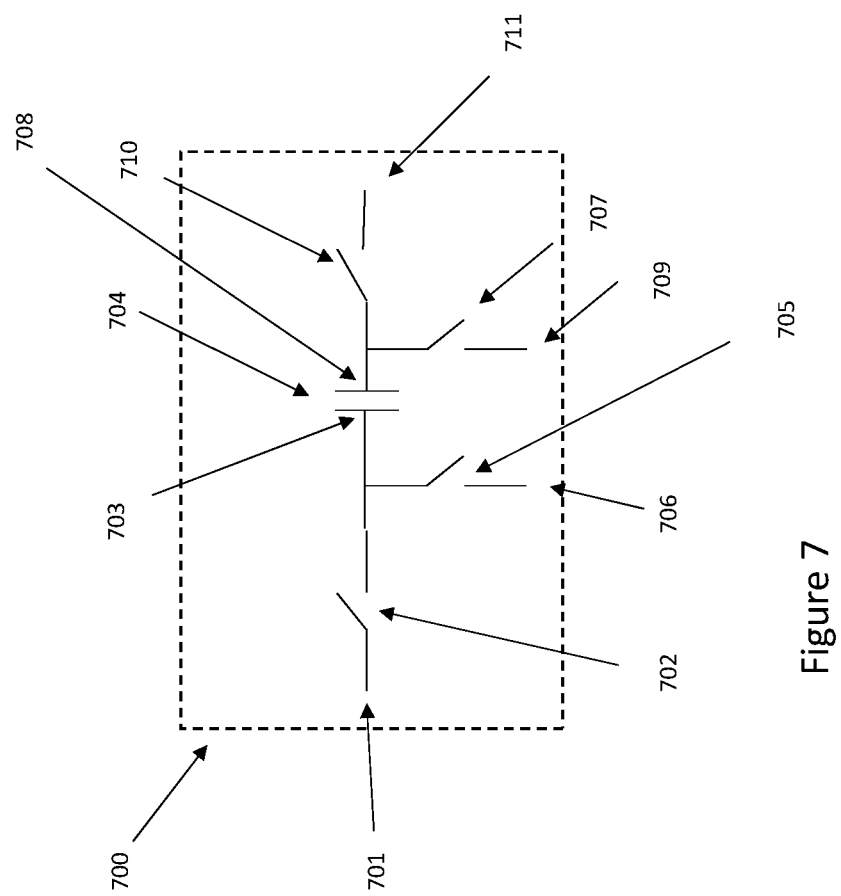
FIG. 7 is a schematic diagram of a coupling circuit according to an embodiment.

FIG. 7 is a schematic diagram of a coupling switch network 700 according to an embodiment. The coupling switch network comprises a first input 701, which is coupled to the first integrator output 210. The first coupling switch 702 couples the first integrator output, via the first input 701 and a first terminal 703 of a coupling capacitor 704. A second coupling switch 705 couples a first terminal 703 of the coupling capacitor 704 and the common mode voltage source 706. A third coupling switch 707 couples the second terminal 708 of the coupling capacitor 704 to a common mode voltage source 709. A fourth coupling switch 710 couples the second terminal 708 of the coupling capacitor 704 to an output 711 of the coupling network, which is coupled to the second integrator input 604.

Figure 8:
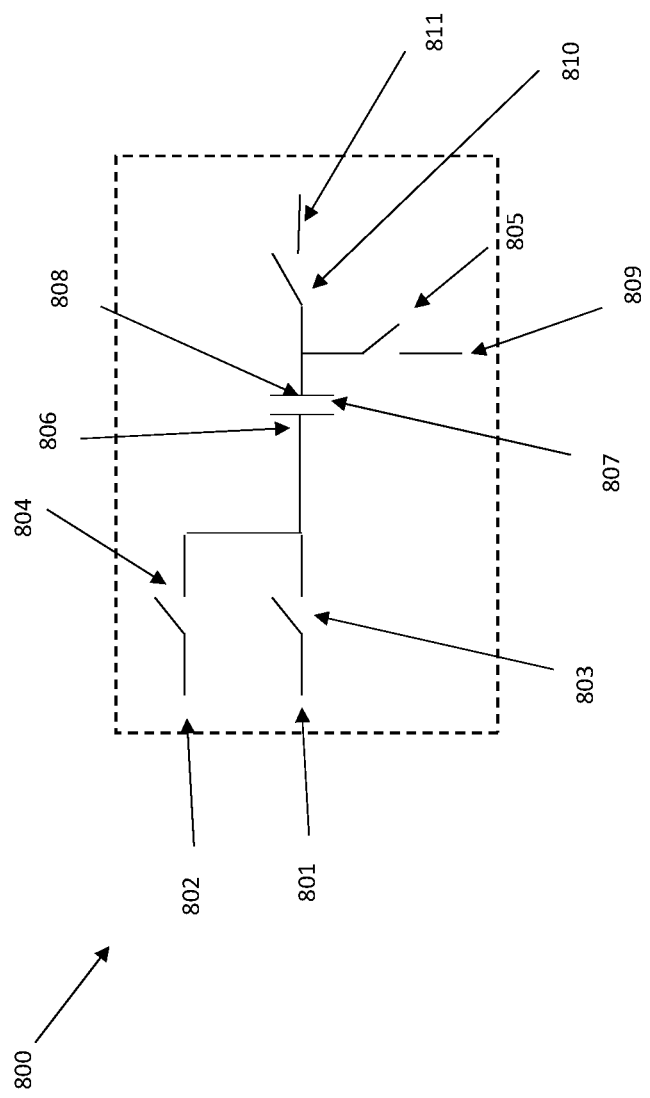
FIG. 8 is a schematic diagram of a second switch network according to an embodiment.

FIG. 8 schematic diagram of a second switch network 800. The network comprises a first input 801, a second input 802, a second controllable common voltage switch 803, a second controllable reference switch 804, a second switched capacitor 807, with a first terminal 806 and a second terminal 808, a second controllable ground switch 805 connected to ground 809, a second controllable output switch 810, connected to output 811. The first input 801 is connected to a common mode voltage source, the second input 802 is connected to the reference voltage source, and an output 811 of the second switch network is coupled to the summing junction of the second integrator.

Figure 9A:
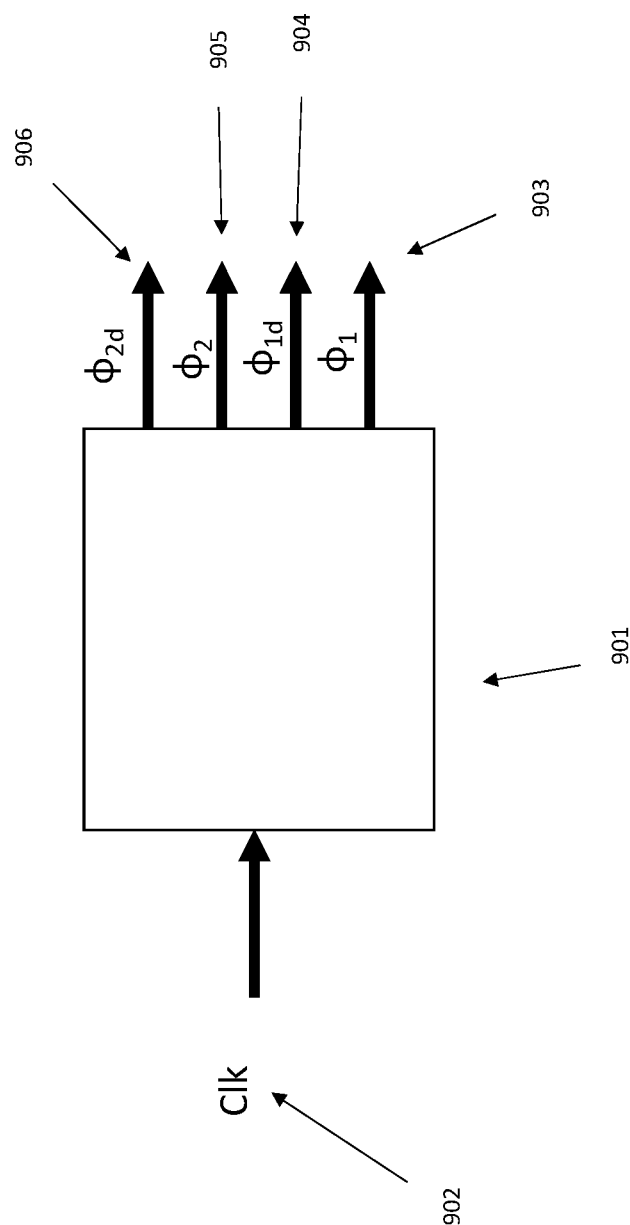
FIG. 9(a) is a diagram illustrating a timing circuit.

In an embodiment a timing engine provides four timing signals in each clock cycle. FIG. 9(a) is a diagram of an arrangement of a timing engine 901. A clock signal 902 is received and the timing engine 901 is configured to provide four timing signals in sequence, namely a first phase timing signal ($\phi_1$) 903 defining the first clock phase, a first further phase timing signal ($\phi_{1d}$) 904, a second phase timing signal ($\phi_2$) 905 defining the second clock phase and a second further phase timing signal ($\phi_{2d}$) 906 controlling the first coupling switch.

Figure 9B:
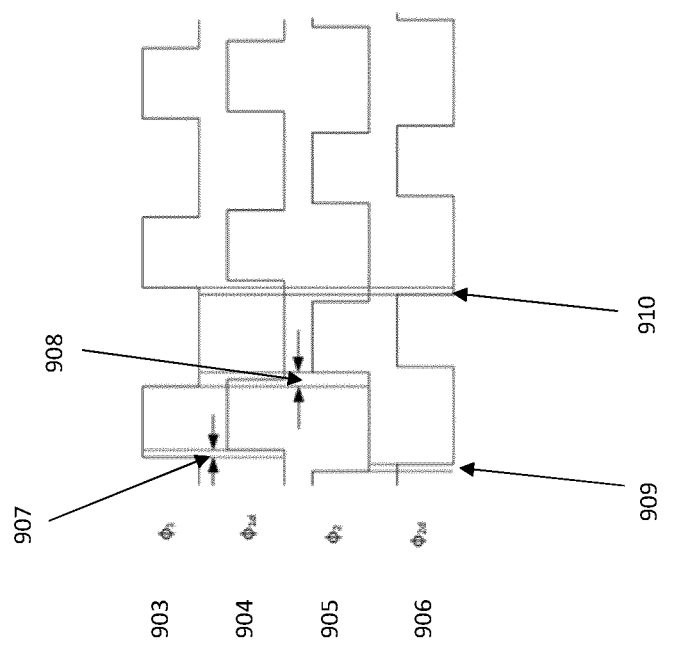
FIG. 9(b) is a timing diagram illustrating output signals of the timing circuit of FIG. 9(a).

FIG. 9(b) is a diagram of the clock signals output by the timing engine of FIG. 9(a) according to an embodiment. The diagram shows the four output signals 903, 904, 905, 906, wherein the first further timing signal 904 is a slightly delayed version of the first timing signal 903. The first timing signal leads the first further timing signal by a first delay 907. The second timing signal is in approximate anti-phase to the first timing signal, but there is a second delay 908 between the falling edge of first timing signal and the rising edge of the second timing signal. The second further timing signal lags the second timing signal by a third delay 909. The falling edge of the second further timing signal leads the rising edge of the first time in signal by a fourth delay 910. Thus in implementations $\phi_{1d}$ and $\phi_{2d}$ are the delayed clocks of $\phi_1$, and $\phi_2$, and the first and second phase timing signals are non-overlapping as shown (i.e. $\phi_1$, $\phi_{1d}$ do not overlap $\phi_2$, $\phi_{2d}$). The relative timing of the respective timing signals can be altered, and the invention is not limited to any one particular timing sequence.

Timing signals $\varphi_1$ and $\varphi_2$ control respectively the phases of the first switch circuit. The timing signal $\varphi_1$ initiates the first phase, in which the voltage is sampled in the first switch circuit, and the first switched capacitor is charged using one of two voltages levels according to the comparator output. The timing signal $\varphi_2$ initiates the second phase, in which the first switch capacitor is connected to the summing junction of the first integrator and a charge dump onto the first feedback capacitor occurs.

In operation the coupling switch network and the second switch network are controlled by the timing signals. The first coupling switch 702 is controlled by the second further timing signal ($\phi_{2d}$). The second coupling switch 705 is controlled by the first further timing signal ($\phi_{1d}$). The third coupling switch 707 is controlled by the first signal ($\phi_1$). The fourth coupling switch 710 is controlled by the second timing signal ($\phi_2$).

In an embodiment, the timing signals $\varphi_1$ and $\varphi_2$ also control the second switch network. In an embodiment, the timing of the switching is the reverse of the sequence for the first switch network. The second network is configured so that the first timing signal controls the operation of the second controllable output switch 810 and the second timing signal controls the operation of the second controllable ground switch 805.

Figure 10:
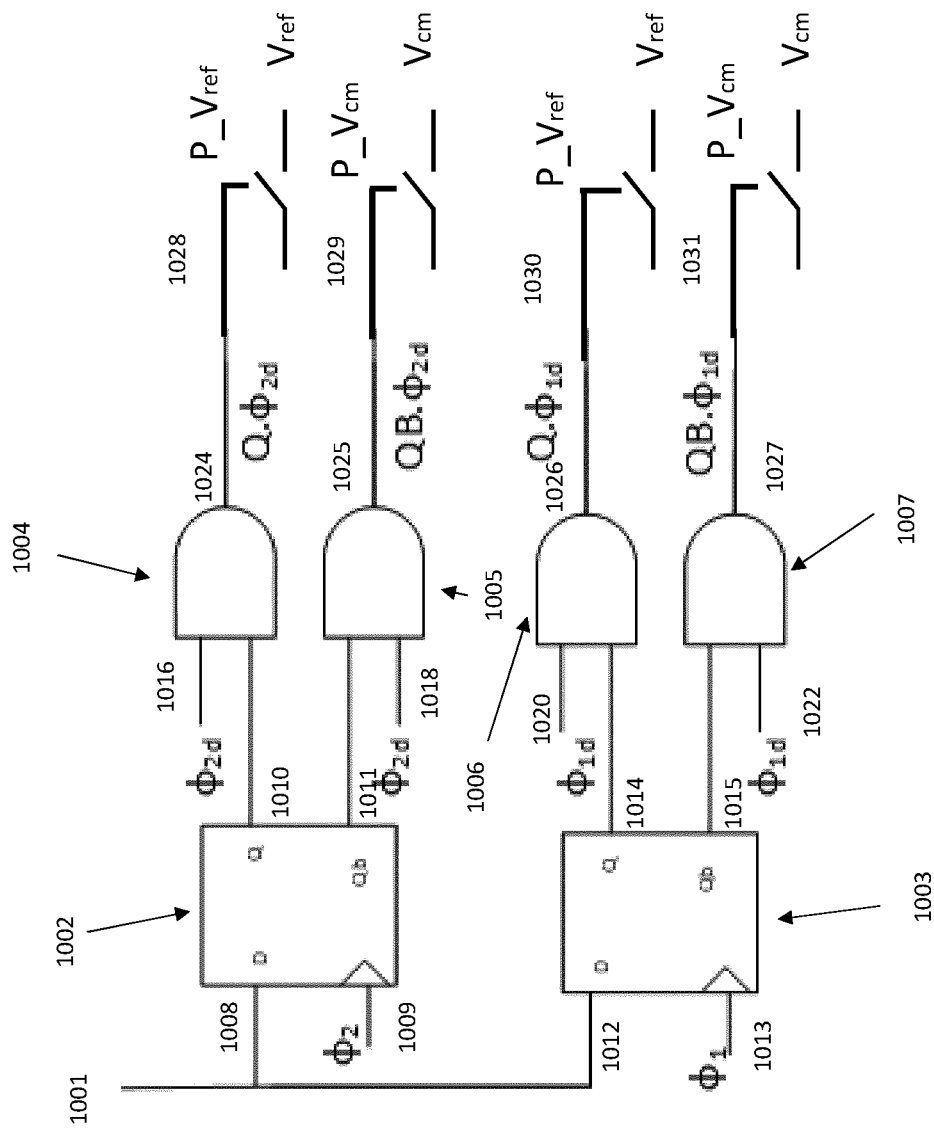
FIG. 10 is a schematic diagram illustrating a latch circuit according to embodiment.

FIG. 10 schematic diagram of the latch circuit according to an embodiment. The latch circuit comprises a latch circuit input 1001, first flip-flop 1002, a second flip-flop 1003, a first AND gate 1004, a second AND gate 1005, a third AND gate 1006, a fourth AND gate 1007, a first output 1028, a second output 1029, third output 1030, and the fourth output 1031. There are also four timing signal inputs, 1016, 1018, 1020, 1022 (for, respectively, $\phi_{2d}$, $\phi_{2d}$, $\phi_{1d}$, $\phi_{1d}$) connected respectively to the inputs of the AND gates. The first timing signal input 1016 and the second timing signal input 1018, linked respectively to inputs of the first and second AND gates, receive a signal from the second further timing signal. The third timing signal input 1020 and the fourth timing signal input 1022, linked respectively to the inputs of the third and the fourth AND gates, receive a signal from the first further timing signal. The first flip-flop 1002, has a first input 1008 connected to the input 1001 of the latch circuit, which receives an input for the output of the comparator. The second input 1009 of the first flip-flop receives a signal from the second timing signal. The second flip-flop also receives a first input 1012 from the input of the latch circuit 1001 and a second input of the second flip-flop 1013 from the first timing signal. A first output 1010 and a second output 1011 of the first flip-flop of output respectively to the second inputs of the first and second AND gates. A first output 1014 and a second output 1015 of second first flip-flop are respectively provided to the second inputs of the third and fourth AND gates. The output of the first AND gate 1024 is connected to a first output 1028 of the latch circuit. The output for the second AND gate 1025 is connected to a second output 1029 of the latch circuit. The output for the third AND gate 1026 is connected to a third output 1030 of the latch circuit. The output for the fourth AND gate 1027 is connected to a fourth output 1031 of the latch circuit. In an embodiment, the first output 1028 and the third output 1030 are connected to a control terminal of the controllable reference voltage switch 304, and the second output 1029 and the fourth output 1031 are connected to a control terminal of the common mode voltage switch 305.

In an embodiment, the first output 1028 and the third output 1030 are additionally connected to a control terminal of the second controllable reference switch 804 and the second output 1029 and the fourth output 1031 are additionally connected to a control terminal of the common mode voltage switch 305. In an embodiment, the second output 1029 and the fourth output 1031 are additionally connected to the second coupling switch 705 and to the third coupling switch 707.

Figure 11:
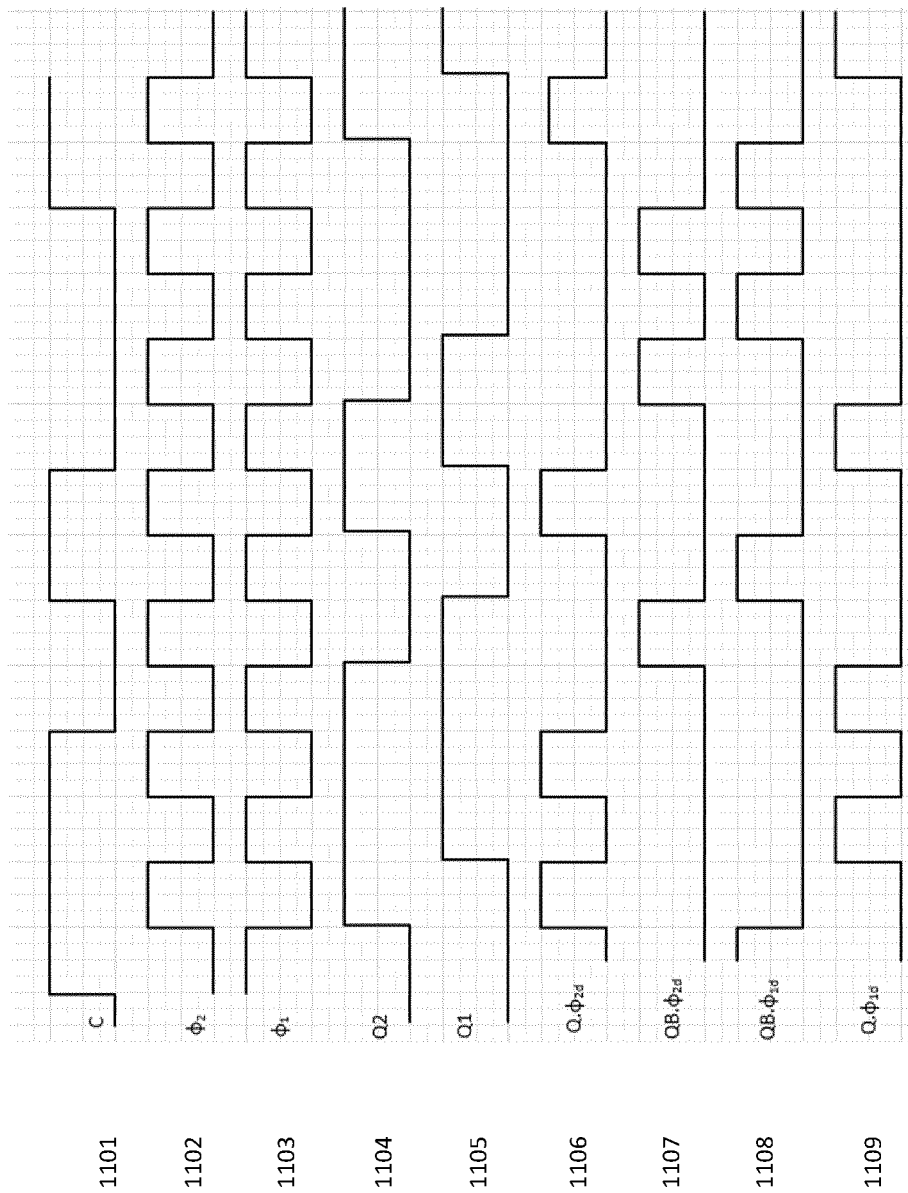
FIG. 11 is a timing diagram illustrating inputs, outputs and intermediary signals of the latch circuit according to the embodiment of FIG. 10.

FIG. 11 is a timing diagram illustrating timing inputs, intermediate signals and outputs of the latch circuit. The inputs comprise the first timing signal 1102 and the second timing signal 1103, which are derived from the clock signal 1101 by the timing engine. The two intermediate signals 1104, 1105, are the first outputs of the first and second flip-flops respectively. The four output signals 1106, 1107, 1108, 1109, the output respectively to the first latch output 1028, the second latch output 1029, the third latch output 1030 in the fourth latch output 1031. These outputs provide the control signals for the common mode voltage and the reference voltage.

Figure 12A:
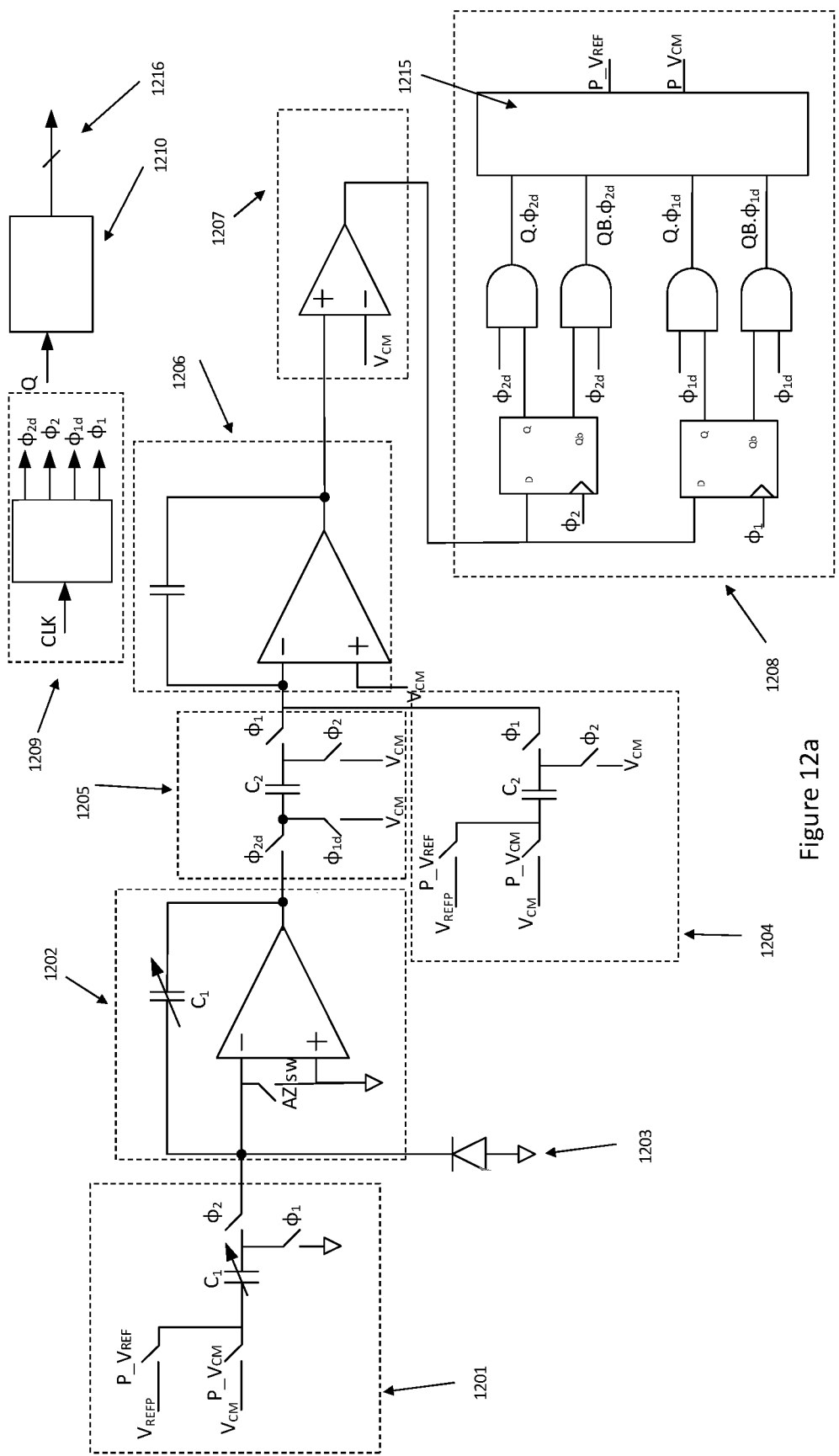
FIGS. 12(a) and 12(b) are a schematic diagrams of example sensor circuit according to embodiments.

FIG. 12a is a sensor circuit according to an embodiment. This embodiment comprises a first switch network 1201 according to the embodiment of FIG. 3, a first stage integrator 1202, photodiode 1203, a second switch network 1204, according to the embodiment of FIG. 8. The integrator 1202 may be provided with a controllable auto-zeroing switch, AZ, configured to connect the integrator inputs. The sensor circuit may include a coupling network 1205, according to the embodiment of FIG. 7. The sensor circuit may also include a second stage integrator 1206, a comparator 1207, and a latch circuit 1208 for example according to the embodiment of FIG. 10. The latch circuit 1208 may include a logic block 1215 which combines the signals shown in FIG. 10 to provide control signals P_V$_{REF}$, V_V$_{CM}$ to the first switch network 1201, e.g. by ORing. The system is controlled by a clock and timing engine 1209, for example as shown in FIG. 9(a). A decimator 1210 or other filter may be used to filter a digital output e.g. derived from the comparator output (Q) of the circuit to provide a multibit, e.g. 16 bit, digital output 1216 which is a digitized version of the analogue input signal. Alternatively a digital signal derived from the comparator output may be used as a digital output signal without further filtering. In an embodiment the decimator 1210 comprises a third order decimator. In an embodiment, a gain may be achieved by selection of the relative capacitances of the second switched capacitor and the second feedback capacitor. A typical ratio of the capacitances is 1:4, but the invention is not limited to any given ratio and consequent gain value. As illustrated flip around switches may be used to reduce switch induced errors. This has been shown to achieve a 50% better performance.

In embodiments, gain programmability is achieved by Vref and Tclk, rather than introducing programmability in the feedback capacitor (which approach will have more switches in the signal path and hence be prone to more switch induced errors). Noise can be further reduced by oversampling. Architectures according to embodiments can achieve same noise performance irrespective of the light input for a given gain settings.

Architectures according to embodiments can achieve a very low noise performance compared to the conventional asynchronous light to digital converter.

In an embodiment, the output code can truncated to 16 bit. The digital output code may thereby be given by the following equation:

$$\text{Code} = \frac{I^{photo} * T_{clk} 2^{15}}{4 * C_{s1} * V_{ref}} \quad \text{Equation 3}$$

where Iphoto is the photodiode current, Tclk is the frequency at which sigma delta operates, 4*Cs1 is the feedback capacitor, and Vref is the reference voltage. Other truncations are possible and the invention is not limited to any one coding scheme.

Figure 12B:
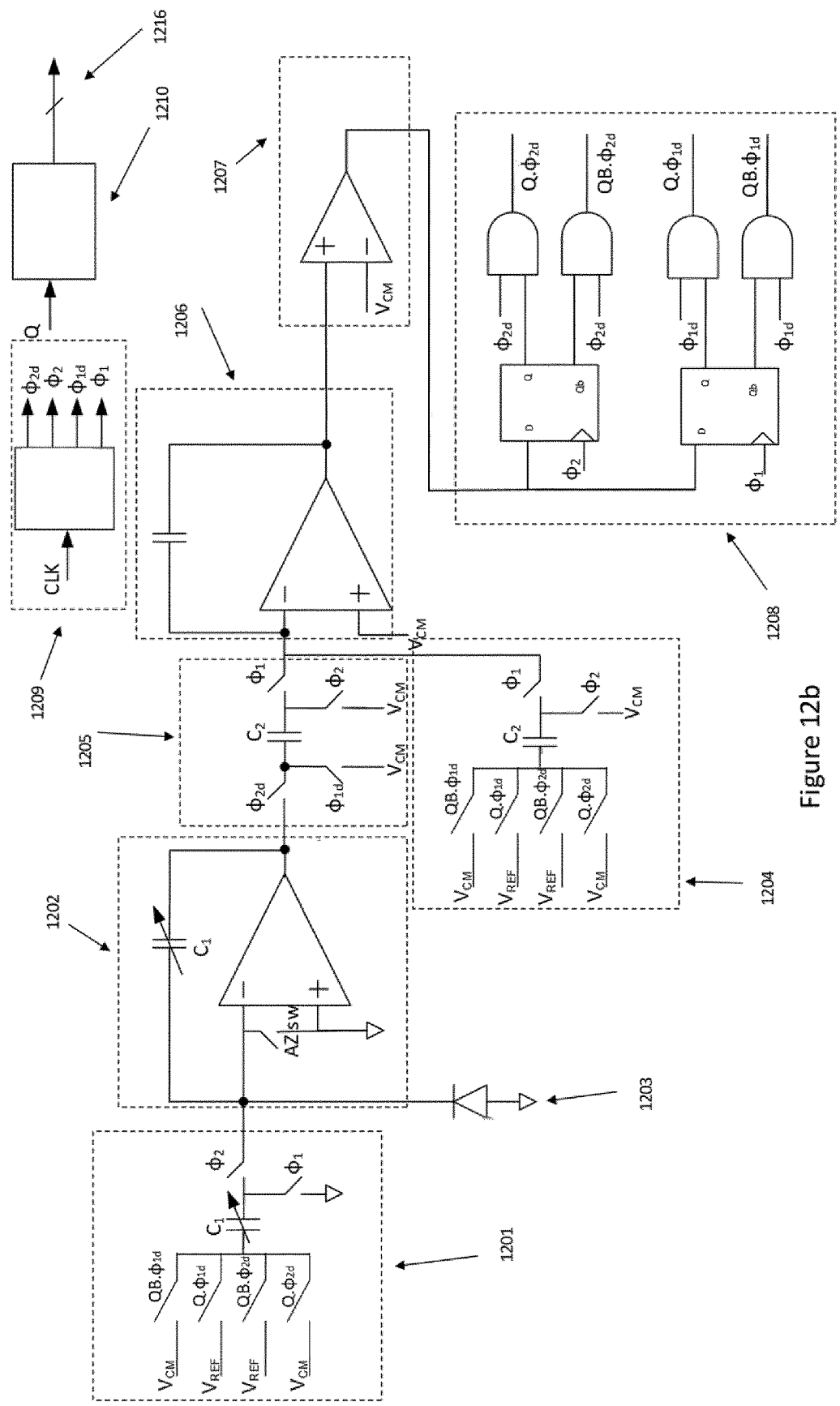

FIG. 12b shows an alternative sensor circuit according to an embodiment; like elements to those of FIG. 12(a) are indicated by like reference numerals. In the alternative sensor circuit rather than using a first switch network 1201 according to the embodiment of FIG. 3, one or both of the first switch network 1201 and the second switch network 1204 includes a pair of switches for each of V$_{CM}$ and V$_{REF}$ respectively. These switches may be controlled respectively by signals QB. $\phi_{1d}$, Q. $\phi_{2d}$ and Q. $\phi_{1d}$, QB. $\phi_{2d}$ where Q represents the (synchronized) comparator output (and QB= $\overline{Q}$).

LIST OF REFERENCE NUMERALS

100 schematic diagram of an ambient light sensor system
101 photodiode
101a photodiode current
102 operational amplifier
103 integrating capacitor
104 switched reference circuit
105 comparator
106 control logic
107 digital output
108 trim signal
200 schematic diagram of a sensor circuit
201 sensor input
202 delta-sigma analogue to digital converter
203 first switch network
204 converter clock
205 controller
206 photodiode
207 first integrator
208 first feedback capacitor
209 first integrator input
210 first integrator output
211 comparator
212 first summing junction
213 first switched capacitor
215 common mode voltage source
216 reference voltage source
217 first timing signal
218 second timing signal
219 first comparator input
220 second comparator input
221 comparator output
300 switch network
301 common mode voltage
302 reference voltage
303 controllable common mode voltage switch
304 controllable reference voltage switch
305 controllable ground switch
306 first terminal of first switched capacitor
307 first switched capacitor
308 second terminal of first switched capacitor
309 ground
310 controllable integrator input switch
311 output of the first switch network
401 first timing signal
402 comparator decision
403 comparator decision logical level "0"
404 sampled voltage set to Vcm-Vref
405 comparator decision logical level "1"
406 sampled voltage set to Vcm+Vref
407 sampling of voltage
408 second timing signal received
409 couple second terminal of first switched capacitor to the summing junction
500 first clock phase
501 second clock phase
601 second stage
602 second integrator
603 second summing junction
604 second integrator input
605 second feedback capacitor
606 second integrator output
607 coupling switch network
608 second switch circuit
609 second switched capacitor
700 coupling switch network
701 first input
702 first coupling switch
703 first terminal of coupling capacitor
704 coupling capacitor
705 second coupling switch
706 common mode voltage source 707 third coupling switch fourth coupling switch
708 second terminal of coupling capacitor
709 common mode voltage source
710 fourth coupling switch
711 output of coupling network
800 second switch network
801 first input
802 second input
803 second controllable common voltage switch
804 second controllable reference switch
805 second controllable ground switch
806 first terminal
807 second switched capacitor
808 second terminal
809 ground
810 second controllable output switch
811 output
901 timing engine
902 clock signal
903 first phase timing signal
904 first further phase timing signal
905 second phase timing signal
906 second further phase timing signal
907 first delay
908 second delay
909 third delay
910 fourth delay
1001 latch circuit input
1002 first flip-flop
1003 second flip-flop
1004 first AND gate
1005 second AND gate
1006 third AND gate
1007 fourth AND gate
1008 first output
1009 second input of first flip-flop
1010 first output of first flip-flop
1011 second output of first flip-flop
1012 first input of second flip-flop
1013 second input of second flip-flop
1014 first output of second flip-flop
1015 second output of second flip-flop
1016 timing signal input
1018 timing signal input
1020 timing signal input
1022 timing signal input
1024 output of first AND gate
1025 output of second AND gate
1026 output of third AND gate
1027 output of fourth AND gate
1028 first output of latch circuit
1029 second output of latch circuit
1030 second output of latch circuit
1031 second output of latch circuit
1201 first switch network
1202 first stage integrator
1203 photodiode
1204 second switch network
1205 coupling network
1206 second stage integrator
1207 comparator
1208 latch circuit
1209 timing engine
1210 decimator
1215 logic block
1216 digital output Features of the circuits and methods which have been described or depicted herein in combination e.g. in an embodiment, may be implemented separately or in sub-combinations. Features from different embodiments may be combined. Thus each feature disclosed or illustrated in the present specification may be incorporated in the invention, whether alone or in any appropriate combination with any other feature disclosed or illustrated herein. Method steps should not be taken as requiring a particular order e.g. that in which they are described or depicted, unless this is specifically stated.

Aspects of the method and system have been described in terms of embodiments but these embodiments are illustrative only and that the claims are not limited to those embodiments. Those skilled in the art will be able to make modifications and alternatives in view of the disclosure which are contemplated as falling within the scope of the claims.

The invention claimed is:

1. A sensor circuit comprising:
a sensor input;
a delta-sigma analogue to digital converter comprising:
a first integrator having a first summing junction at a first integrator input, wherein the sensor input is coupled to the first summing junction, a first feedback capacitor, and a first integrator output,
a comparator coupled to the first integrator output and configured to compare the first integrator output with a comparator reference to generate a comparator output,
a digital output coupled to the comparator output, and
a converter clock;
wherein the delta-sigma analogue to digital converter further comprises:
a first switched capacitor;
a common mode voltage source providing a common mode voltage;
a reference voltage source providing a reference voltage;
a first switch network configured to, in a first clock phase, connect the first switched capacitor to one of the common mode voltage and the reference voltage to charge the switched capacitor to either a sum of the common mode voltage and the reference voltage or a difference between the common mode voltage and the reference voltage, and in a second clock phase, connect the first switched capacitor to transfer charge from the first switched capacitor into the first summing junction;
a controller to control the first switch network responsive to the comparator output to selectively connect the first switched capacitor to one of the common mode voltage and the reference voltage in the first clock phase.

2. The sensor circuit of claim 1 wherein the switch network comprises a controllable common mode voltage switch and a controllable reference voltage switch each coupled to a first terminal of the first switched capacitor, a controllable ground switch coupled to a second terminal of the first switched capacitor, and a controllable integrator input switch coupled between the second terminal of the first switched capacitor and the summing junction.

3. The sensor circuit of claim 2 wherein the controller is configured to, in the first clock phase, control the controllable common mode voltage switch and the controllable reference voltage switch to connect the first terminal of the first switched capacitor to one of the common mode voltage and the reference voltage and to control the controllable ground switch to connect the second terminal of the first switched capacitor to ground, and is configured to, in the second clock phase, control the controllable integrator input to couple the second terminal of the first switched capacitor to the summing junction.

4. The sensor circuit of claim 1, wherein the delta-sigma analogue to digital converter further comprises a second integrator coupled between the first integrator and the comparator, the second integrator comprising a second summing junction at a second integrator input, a second feedback capacitor and a second integrator output, the second integrator input being coupled to the first integrator output and the second integrator output being coupled to the comparator input.

5. The sensor circuit of claim 4, further comprising a coupling capacitor and a coupling switch network, to couple the first integrator output to the second integrator input, wherein the coupling switch network is configured first to couple a voltage from the first integrator output to charge the coupling capacitor and then to couple charge from the coupling capacitor to the second integrator input.

6. The sensor circuit of claim 5 wherein the coupling switch network comprises:
a first coupling switch coupling the first integrator output and a first terminal of the coupling capacitor;
a second coupling switch coupling the first terminal of the coupling capacitor and the common mode voltage source;
a third coupling switch coupling a second terminal of the coupling capacitor to the second integrator input; and
a fourth coupling switch coupling the second terminal of the coupling capacitor the common mode voltage source.

7. The sensor circuit of claim 5, further comprising a second switched capacitor coupled to the second summing junction, and a second switch network configured to, in the second clock phase, connect the second switched capacitor to one of the common mode voltage and the reference voltage to charge the second switched capacitor to either a sum of the common mode voltage and the reference voltage or a difference between the common mode voltage and the reference voltage, and in the first clock phase, connect the second switched capacitor to transfer charge from the second switched capacitor into the second summing junction.

8. The sensor circuit of claim 6, wherein the converter clock is configured to provide:
a first phase timing signal ($\phi_1$) defining the first clock phase and controlling the third coupling switch;
a first further phase timing signal ($\phi_{1d}$) controlling the second coupling switch;
a second phase timing signal ($\phi_2$) defining the second clock phase and controlling the fourth coupling switch; and
a second further phase timing signal ($\phi_{2d}$) controlling the first coupling switch.

9. The sensor circuit of claim 5, wherein a gain of sensor circuit is determined by a ratio of a value of the second feedback capacitor to a value of the coupling capacitor.

10. The sensor circuit of claim 7, wherein one or more of the first switched capacitor, the coupling capacitor, the second switched capacitor, the first feedback capacitor, and the second feedback capacitor, are variable capacitors.

11. The sensor circuit of claim 1, further comprising a decimator coupled between the comparator output and the digital output.

12. The sensor circuit of claim 1, wherein the controller further comprises a latch circuit coupled between the comparator output and the controller to synchronize changes in the comparator output to one or both of the first clock phase and the second clock phase.

13. The sensor circuit of claim 8, wherein the controller further comprises logic circuitry and is configured i) to combine the comparator output synchronized to the first clock phase ($\phi_1$) with the first further phase timing signal ($\phi_{1d}$), and ii) to combine the comparator output synchronized to the second clock phase ($\phi_2$) with the second further phase timing signal ($\phi_{2d}$), to generate combined signals for the logic circuitry to generate one or more control signals to control the first switch network.

14. The sensor circuit of claim 1, configured transfer charge to the first feedback capacitor on each clock cycle irrespective of a comparator decision indicated by the comparator output.

15. A light sensor comprising the sensor circuit of claim 1 and a photodiode, wherein photodiode is coupled to the sensor input.

* * * * *